United States Patent
Hino et al.

(10) Patent No.: US 8,421,304 B2
(45) Date of Patent: Apr. 16, 2013

(54) ACTUATOR AND ACTUATOR STRUCTURE

(75) Inventors: Tetsuo Hino, Yamato (JP); Sotomitsu Ikeda, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 106 days.

(21) Appl. No.: 13/196,649

(22) Filed: Aug. 2, 2011

(65) Prior Publication Data

US 2012/0032559 A1 Feb. 9, 2012

(30) Foreign Application Priority Data

Aug. 5, 2010 (JP) ................................ 2010-176366

(51) Int. Cl.
*H01L 41/08* (2006.01)

(52) U.S. Cl.
USPC ............ 310/300; 310/311; 310/330; 310/800

(58) Field of Classification Search .................. 310/300, 310/311, 330–332
See application file for complete search history.

(56) References Cited

U.S. PATENT DOCUMENTS

| | | | | |
|---|---|---|---|---|
| 4,812,698 A | * | 3/1989 | Chida et al. ............... | 310/330 |
| 5,889,354 A | * | 3/1999 | Sager ........................ | 310/331 |
| 6,555,945 B1 | * | 4/2003 | Baughman et al. ......... | 310/300 |
| 7,005,781 B2 | * | 2/2006 | Smits ....................... | 310/331 |
| 2007/0184238 A1 | * | 8/2007 | Hockaday et al. .......... | 428/98 |
| 2011/0098643 A1 | * | 4/2011 | Chiang et al. .............. | 604/131 |
| 2012/0032553 A1 | * | 2/2012 | Goyal et al. ............... | 310/300 |

FOREIGN PATENT DOCUMENTS

| JP | 2007-028749 A | 2/2007 |
|---|---|---|
| JP | 2009-55717 A | 3/2009 |

* cited by examiner

*Primary Examiner* — Mark Budd
(74) *Attorney, Agent, or Firm* — Canon U.S.A, Inc. IP Division

(57) ABSTRACT

An actuator includes a first bending portion having a first electrode layer, a first electrolyte layer on a first surface of the first electrode layer, and a second electrode layer in contact with the first electrolyte layer; and a second bending portion having the first electrode layer, a second electrolyte layer on a second surface of the first electrode layer, the second surface facing the first surface, and a third electrode layer in contact with the second electrolyte layer, in which the first surface of the first electrode layer includes a region where the first electrolyte layer is not arranged, the second surface of the first electrode layer includes a region where the second electrolyte layer is not arranged, the first bending portion is adjacent to the second bending portion, and the bending direction of the first bending portion is opposite to the bending direction of the second bending portion.

7 Claims, 6 Drawing Sheets

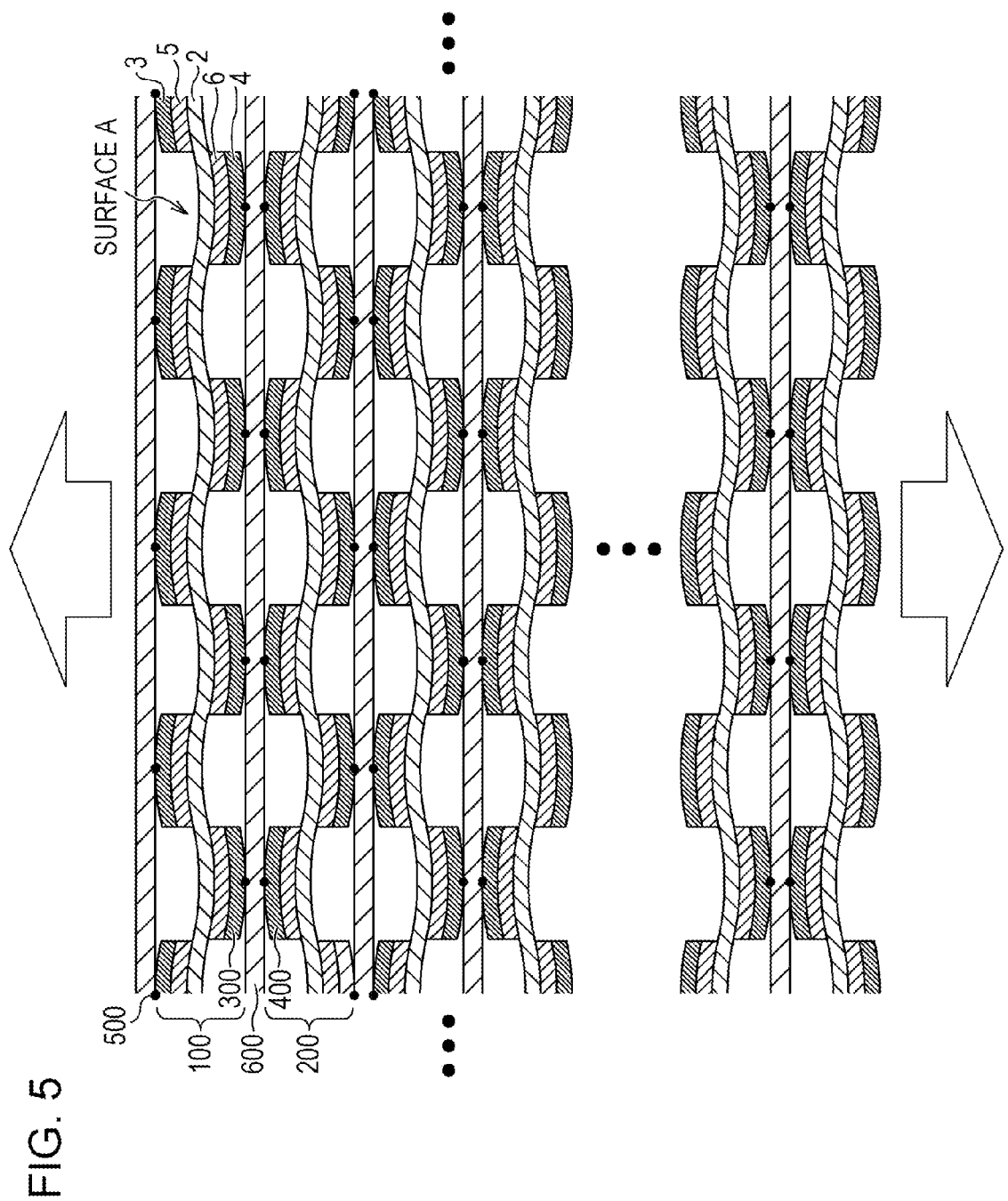

ACTUATOR AND ACTUATOR STRUCTURE

BACKGROUND OF THE INVENTION

1. Field of the Invention

Embodiments of the present invention relate to a bending-type polymer actuator.

2. Description of the Related Art

In recent years, actuators have been developed. In particular, actuators using polymer materials have been developed. For example, it is known that an actuator having a three-layer structure in which electrode layers are arranged on a front surface and a back surface a plate-like electrolyte layer. This type of actuator is referred to as a bending-type actuator because it bends by applying a voltage between the electrodes.

Japanese Patent Laid-Open No. 2007-028749 discloses an actuator element in which adjacent bending portions bend in mutually opposite directions. This patent literature states that bending motions of the actuator elements are easily converted into linear motions by connecting a plurality of the actuator elements.

FIGS. 4A to 4D illustrate the actuator element 50 described in Japanese Patent Laid-Open No. 2007-028749. FIG. 4A is a perspective view of the actuator element. FIGS. 4B to 4D are explanatory drawings. FIG. 4B illustrates the structure of the actuator element when viewed from the front. FIG. 4C illustrates the structure of the actuator element when viewed from the side. FIG. 4D illustrates the structure of the actuator element when viewed from the rear.

An electrode layer 41a and an electrode layer 42a' are arranged on the same surface of an electrolyte layer 40. An electrode layer 41a' and an electrode layer 42a are arranged on a surface (rear surface) opposite the surface on which the electrode layer 41a and the electrode layer 42a' are arranged. The electrode layer 41a and the electrode layer 42a' are insulated by an insulating portion 43. The electrode layer 41a' and the electrode layer 42a are also insulated by the insulating portion 43.

The electrode layer 41a' is not arranged at a position directly opposite to the electrode layer 41a but is arranged at an offset position. The electrode layer 41a' is connected to the electrode layer 41a by a narrow electrode portion (connection portion) 44 on a side of the electrolyte layer 40. The electrode layer 42a' is also arranged at an offset position on the rear surface with respect to the electrode layer 42a. The electrode layer 42a' is connected to the electrode layer 42a by a narrow electrode portion 45.

The electrode layers 41a and 41a' have the same potential because they are connected by the narrow electrode portion 44. The electrode layer 42a and the electrode layer 42a' have the same potential because they are connected by the narrow electrode portion 45.

By applying a voltage difference between opposite electrodes, one half of the actuator element 50 undergoes bending deformation so as to have a convex shape, the other half undergoes bending deformation so as to have a concave shape.

The actuator element possesses the following problems.

(1) The electrode layers on the front and rear surfaces are connected by the narrow electrode portions on the sides of the actuator element. So, electric fields at electrode portions are disturbed, causing nonuniform bending deformation or twisting. As a result, local stresses occur near the narrow electrode portions, causing the detachment of the narrow electrode portions, in some cases.

(2) Because the narrow electrode portions are used, the portions are broken by an external force.

SUMMARY OF THE INVENTION

One disclosed aspect of the embodiments provides an actuator having improved operation durability, in which the actuator undergoes bending deformation in the form of a wave, i.e., one end of the actuator bends upward, and the other end bends downward.

According to one aspect of the embodiments, an actuator includes a first bending portion having a first electrode layer, a first electrolyte layer on a first surface of the first electrode layer, and a second electrode layer in contact with the first electrolyte layer; and a second bending portion having the first electrode layer, a second electrolyte layer on a second surface of the first electrode layer, the second surface facing the first surface, and a third electrode layer in contact with the second electrolyte layer, in which the first surface of the first electrode layer includes a region where the first electrolyte layer is not arranged, the second surface of the first electrode layer includes a region where the second electrolyte layer is not arranged, the first bending portion is adjacent to the second bending portion, and the bending direction of the first bending portion is opposite to the bending direction of the second bending portion.

According to aspects of the embodiments, portions of the common first electrode layer are included in the first bending portion and the second bending portion. The electrode layer also functions as a supporting substrate, thereby improving the durability.

Further features of the present invention will become apparent from the following description of exemplary embodiments with reference to the attached drawings.

BRIEF DESCRIPTION OF THE DRAWINGS

FIG. 5 is a schematic view of an actuator structure according to a fifth embodiment.

DESCRIPTION OF THE EMBODIMENTS

Embodiments according to the present invention will be described below.

First Embodiment

An actuator according to a first embodiment of the present invention includes a first bending portion located on one surface (surface A) of a first electrode layer and a second bending portion on the other surface (surface B) of the first electrode layer, the first electrode layer functioning as one electrode for each of the bending portions. Here, for convenience, the surface A is also referred to as a "front surface", and the surface B is also referred to as a "back surface". However, they are not intended to specifically limit the scope of the present invention.

Figure 1A:
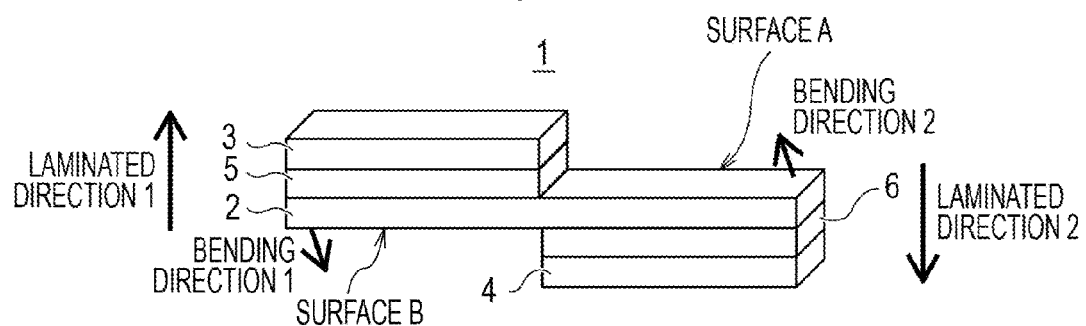
FIGS. 1A to 1C are schematic views of actuators according to a first embodiment of the present invention.
Figure 1B:
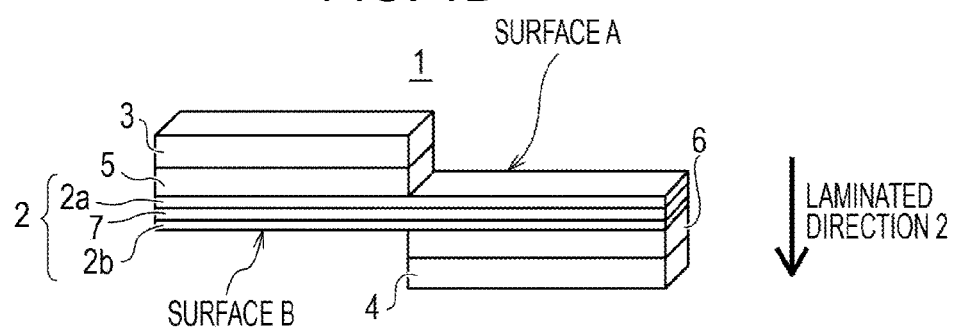
Figure 1C:
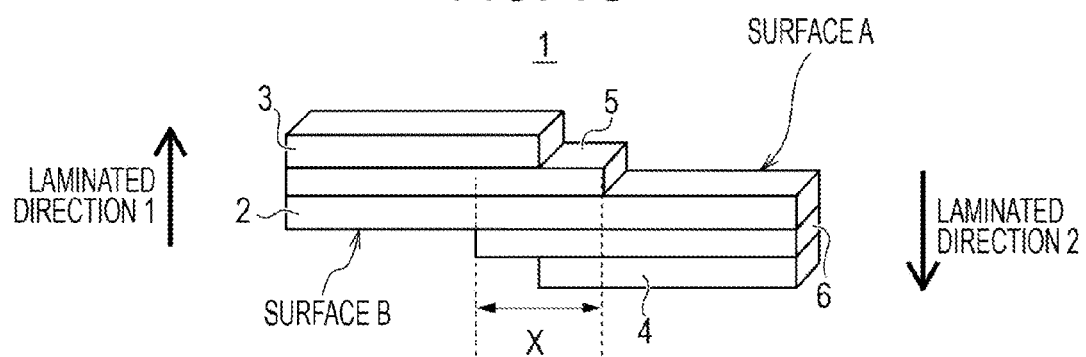

FIGS. 1A to 1C are schematic views of actuators according to the first embodiment of the present invention. FIG. 1A is a perspective view of an actuator. FIG. 1B is a perspective view of an actuator including a first electrode layer having a multilayer structure. FIG. 1C is a perspective view of an actuator in which electrolyte layers are partially exposed. Reference numeral 1 denotes an actuator. Reference numeral 2 denotes a first electrode layer. Reference numeral 5 denotes a first electrolyte layer. The first electrolyte layer 5 is arranged on the surface A of the first electrode layer 2. A second electrode layer 3 is in contact with the first electrolyte layer 5. The first bending portion includes the first electrode layer 2, the first electrolyte layer 5, and the second electrode layer 3.

A second bending portion includes the first electrode layer 2; a second electrolyte layer 6 on the surface B opposite the surface A of the first electrode layer 2; and a third electrode layer 4 in contact with the second electrolyte layer 6. Aspects of the present invention relate to such an actuator including the first bending portion and the second bending portion juxtaposed to each other.

The surface A of the first electrode layer 2 includes a region where the first electrolyte layer 5 is not arranged. The surface B of the first electrode layer 2 includes a region where the second electrolyte layer 6 is not arranged.

The application of a voltage between the first electrode layer 2 and the second electrode layer 3 allows the first bending portion to bend. The application of a voltage between the first electrode layer 2 and the third electrode layer 4 allows the second bending portion to bend. The bending direction of the first bending portion is opposite the bending direction of the second bending portion. As indicated by a bending direction 1 and a bending direction 2 illustrated in FIG. 1A, the bending directions intersect with the surface A and the surface B of the first electrode layer. The bending direction 1 and the bending direction 2 are opposite directions. The term "opposite directions" used here indicate directions of displacement of the bending portions when the bending portions are oppositely arranged on surfaces A and B before bending. A structure in which the bending portions are bent in directly opposite directions can be used. A structure in which the bending portions are bent in opposite directions and the opposite directions intersect can also be used.

As illustrated in FIGS. 1A to 1C, the first electrode layer 2 can have an elongated shape. The second electrode layer 3 serving as a counter electrode is arranged on one surface (surface A) of the first electrode layer 2, and the first electrolyte layer 5 is arranged between the first electrode layer 2 and the second electrode layer 3, thereby providing the first bending portion. The term "bending portion" indicates a portion that can undergo bending deformation by applying a voltage difference between both electrode layers. The third electrode layer 4 serving as a counter electrode and the second electrolyte layer 6 arranged between the first electrode layer 2 and the third electrode 4 are arranged on the back surface (surface B) of the first electrode layer 2, thereby providing the second bending portion.

The first bending portion and the second bending portion have the common electrode, i.e., the first electrode layer. This eliminates the need to form a narrow electrode portion (connection portion) configured to connect first electrode layers on a side portion of the actuator.

Structure of Actuator

The actuator according to this embodiment will be described below with reference to FIGS. 1A to 1C. FIG. 1A is a schematic perspective view of the actuator. The actuator 1 includes the long electrode layer (first electrode layer) 2, the second electrode layer 3 opposite a portion of the surface A of the first electrode layer 2, and the third electrode layer 4 opposite a portion of the surface B of the first electrode layer 2.

The second electrode layer 3 and the third electrode layer 4 are arranged so as to be in contact with the first electrolyte layer 5 and the second electrolyte layer 6, respectively. These electrode layers and electrolyte layers are arranged with the first electrode layer 2 provided therebetween in such a manner that inner end portions of the layers are aligned with each other. The first bending portion includes the first electrode layer 2, the second electrode layer 3, and the first electrolyte layer 5. The second bending portion includes the first electrode layer 2, the third electrode layer 4, and the second electrolyte layer 6. The first and second bending portions adjacent to each other are connected by the common first electrode layer 2. In the figure, terminals configured to apply a voltage between the electrode layers, leads, and a driving power source are omitted.

When a voltage is applied between the second electrode layer 3 and the first electrode layer 2 from the driving power source and a voltage is applied between the first electrode layer 2 and the third electrode layer 4, ions in the electrolyte layers held by the electrode layers transfer to at least one of the holding electrode layers, so that ends (displacement ends) of the actuator in the longitudinal direction undergo bending deformation in the laminated directions (the laminated directions 1 and 2) opposite to each other so as to be displaced in parallel. In FIG. 1A, the laminated direction 1 and the bending direction 1 are opposite directions. The laminated direction 2 and the bending direction 2 are also opposite directions.

A length from one displacement end to the middle portion is equal to a length from the other displacement end to the middle portion. So, as illustrated in FIG. 1A, directions of displacement of the displacement ends are the bending direction 1 and the bending direction 2.

That is, in this structure, the first electrode layer 2 is a single electrode layer common to the plural bending portions. Unlike an actuator element described in Japanese Patent Laid-Open No. 2007-028749, there is no need to form equipotential electrode layers with the layers crossed. In other words, it is possible to form an actuator including the first bending portion (second electrode layer 3/first electrolyte layer 5/first electrode layer 2) and the second bending portion (third electrode layer 4/second electrolyte layer 6/first electrode layer 2) without forming a connection portion configured to cross the electrode layers and apply a voltage.

So, an electric field distribution generated at each of the bending portions of the actuator element is the same as that of an actuator having a three-layer structure of the related art. It is thus possible to inhibit the occurrence of a bending force (stress) in a direction other than the assumed bending direction in the actuator. The first electrode layer serving as a common electrode is not formed by crossing electrodes via a narrow electrode but is formed of a plate-like electrode layer which has a single-layer structure and which is arranged parallel to the second and third electrode layers. It is thus possible to inhibit the occurrence of electrode detachment and disconnection of an electrical connection during operation and to produce an actuator that operates stably.

As illustrated in FIG. 1B, a structure in which the first electrode layer 2 includes a reinforcing component may be used. The arrangement of the reinforcing component necessarily improves the strength of the first electrode layer, thereby improving the strength of the entire actuator element. Thus, the durability is improved against a higher load. In addition, the durability is also increased against an external load (torsion) from a direction other than the assumed bending directions of the actuator (laminated directions of the electrode layers, i.e., the laminated directions 1 and 2). As a result, the actuator has higher operation durability.

The reinforcing component is not particularly limited as long as the arrangement of the reinforcing component increases the stiffness and does not impair the operation of the actuator. In particular, in the case where the reinforcing component is a plate spring (metal plate spring), elastic energy on the basis of the bending operation of the actuator is stored in the plate spring. So, a high driving torque may be obtained at a low force. It is needless to say that any shape of the reinforcing component may be used in addition to the elongated shape, depending on target properties of an actuator.

Furthermore, a single or plurality of the reinforcing components may be used alone or in combination so as to obtain the target properties of an actuator. When the plural reinforcing components are used in combination, the reinforcing components can have different properties from each other, so that properties of the entire actuator element can be adjusted. This makes it possible to further improve the operation durability. Examples of a method for providing different properties at portions where reinforcing components are arranged include 1) a method in which a plurality of reinforcing components having different elastic moduli are used, 2) a method in which reinforcing components different in shape or position are used, and 3) a method in which a plurality of plate springs having different spring constants are used.

In the case where electrolyte layers of adjacent bending portions have an overlapping region (represented by X illustrated in FIG. 1C) with the first electrode layer provided therebetween, the overlapping region can improve the operation durability.

The phrase "an overlapping region with the first electrode layer provided therebetween" used here indicates that when each of the electrolyte layers or each of the electrode layers is projected onto a plane of the first electrode layer (surface A or B) in the laminated direction (laminated direction 1 or 2), an overlapping region is present.

In other words, it is possible to increase the strength of a region where inner end portions of driving sections, which bend in opposite directions, of the actuator are located. So, even when an unanticipated load is applied in an unanticipated direction during the operation of the actuator, the actuator element can operate stably without causing buckling or twisting. In addition, the area of a bonded interface between the first electrode layer and each electrolyte layer is inevitably increased. Thus, interfacial delamination is less likely to occur.

Figure 2A:
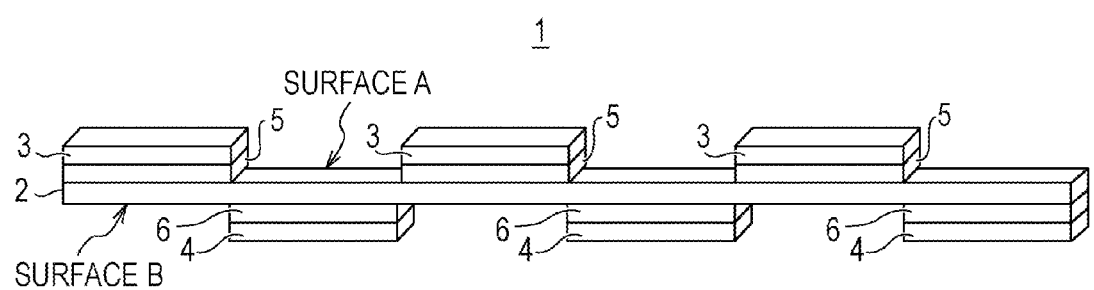
FIGS. 2A and 2B are schematic views of an actuator in which a plurality of bending portions are juxtaposed.
Figure 2B:
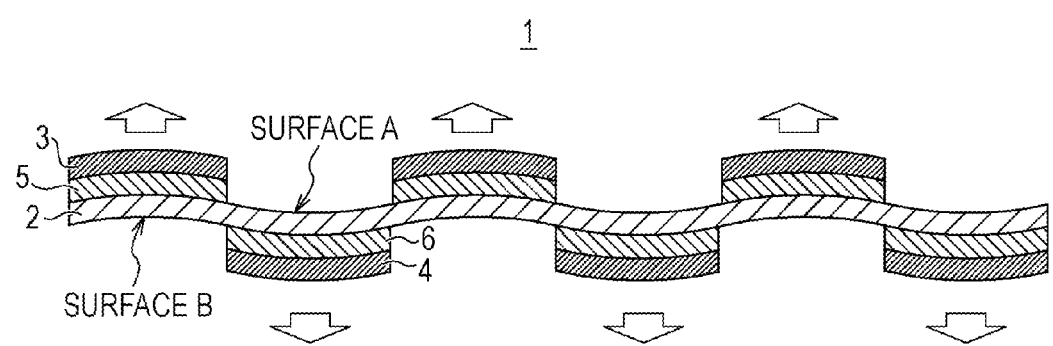

Numbers of the second electrode layers and the third electrode layers in one actuator element are not particularly limited. Any numbers may be used as long as the actuator element has a structure such that adjacent bending portions bend in opposite directions. That is, as illustrated in FIGS. 2A and 2B, an actuator element may have a structure including a plurality of the first bending portions and a plurality of the second bending portions, the first bending portions and the second bending portions being arranged alternately and successively in the longitudinal direction. In other words, the actuator element has a structure in which a plurality of the actuators 1 illustrated in FIG. 1A are juxtaposed on the basis of the first electrode layer.

In this case, it is possible to provide an actuator element that easily generates a higher driving force with high operation durability and high reliability for practical use.

As described above, with respect to the actuator according to an embodiment of the present invention, a structure in which the electrode layers and the electrolyte layers have rectangular cross sections perpendicular to the corresponding laminated directions has been exemplified. However, various shapes may be used in addition to the rectangular plate-like shape. In FIGS. 1A to 1C, the second electrode layers 3 and the third electrode layers 4 have the same shape and size, and the first electrolyte layers 5 and the second electrolyte layers 6 have the same shape and size. However, the electrode layers may have different shapes and different sizes. Surfaces of the electrode layers and exposed surfaces of the electrolyte layers may be covered with insulating layers composed of, for example, a silicone resin. The covering of the insulating layers increases the safety and makes it possible to handle a conducting material as an object to be transferred.

Figure 6A:
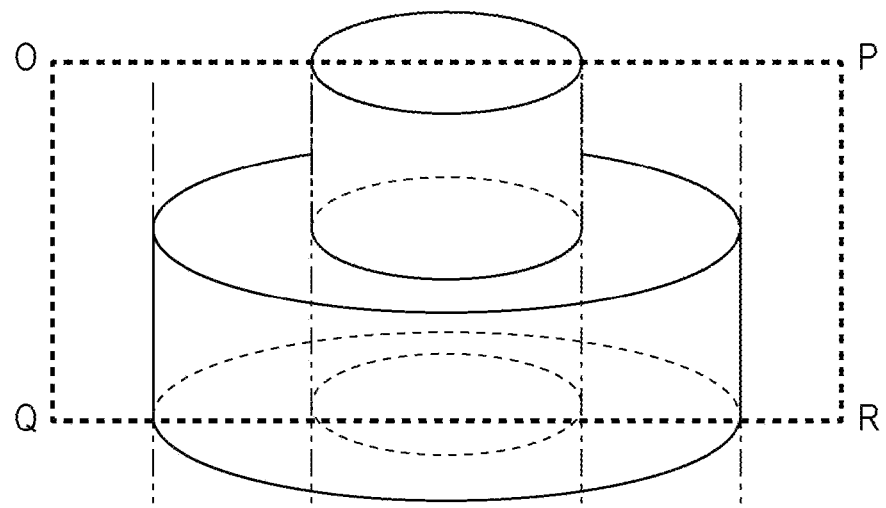
FIGS. 6A and 6B are schematic views of a cylindrical actuator.
Figure 6B:
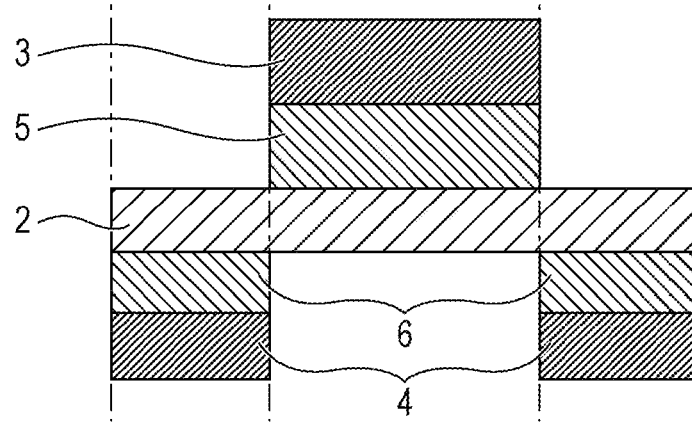

An example other than the structure of the rectangular plate-like shape is a cylindrical actuator as illustrated in FIG. 6A. FIG. 6B is a cross-sectional view taken along plane OPQR of the actuator illustrated in FIG. 6A. Here, the first electrolyte layer 5 and the second electrode layer 3 have a disk-like shape and the same size. The second electrolyte layer 6 and the third electrode layer 4 have an annular shape and the same size. The first electrode layer 2 has a disk-like shape with a size different from that of the first electrolyte layer 5 and the second electrode layer 3. The actuator having such a structure is easily fixed.

As illustrated in FIGS. 2A and 2B, an actuator according to aspects of the embodiments may have a structure in which the first bending portions and the second bending portions are arranged alternately and successively. Furthermore, a plurality of actuators may be stacked.

That is, as illustrated in FIG. 5, the actuators are arranged in such a manner that bending portions of adjacent actuators are in contact with each other and bend in mutually opposite directions, thereby providing an actuator structure that is significantly displaced in the laminated directions by pressing the bending portions against each other. Here, the sizes and thicknesses of the bending portions may not be the same, and they may be optimized, depending on an intended actuator structure as long as the bending portions can bend in mutually opposite directions and can press against each other.

In the case of such a laminated actuator, electrode wiring is inevitably complicated. However, electrode members 600 (common electrode members) configured to commonly apply a voltage are arranged between the second electrode layers 3 (for example, third electrode layers 300 of an upper actuator 100) and the third electrode layers 4 (for example, second electrode layers 400 of a lower actuator 200) of the bending portions of adjacent actuators (for example, the upper actuator 100 and the lower actuator 200) arranged so as to press against each other, thereby omitting electrode wiring. That is, the actuators are arranged in such a manner that the bending portions of adjacent actuators are brought into contact with each other with the common electrode members provided therebetween and that the bending portions bend in mutually opposite directions to press against each other, thereby omitting the electrode wiring.

The common electrode members are not particularly limited as long as they have satisfactory conductivity, do not damage the actuators, and do not interfere with operation. Examples of the common electrode members that can be used include conductive cloths, conductive bands, and wire meshes. Wire meshes are not particularly limited as long as they have satisfactory conductivity and sufficient elasticity and are composed of materials that can be easily processed. For example, stainless wire, tin-plated copper wire, copper-weld wire (tinning, copper, and steel), Monel wire (alloy of copper and nickel), and aluminum wire may be used. Furthermore, the common electrode members may be partially covered with an insulating layer composed of, for example, silicone rubber, so as not to come into contact with the first electrode layers 2.

The size and shape of the common electrode members are not particularly limited. For example, with respect to the shape, an optimum shape, for example, a plate-like shape, a circular shape, or a linear shape, may be appropriately used.

With respect to the common electrode members, electrode wiring can be simplified by arranging one common electrode member for pairs of the bending portions of adjacent actuators that press against each other, rather than by arranging one common electrode member for each pair of the bending portions that press against each other.

Furthermore, in the case where the common electrode members 600 configured to commonly apply a voltage are arranged between the second electrode layers 3 (for example, the third electrode layers 300 of the upper actuator 100) and the third electrode layers 4 (for example, the second electrode layers 400 of the lower actuator 200) of the bending portions of adjacent actuators, these components may be fixed with an adhesive at connecting points 500. Such fixation prevents the displacement of the common electrode members even when the actuator structure is driven over long periods of time. It goes without saying that the adhesive should be used so as not to preclude the electrical conduction of the common electrode members, the second electrode layers, and the third electrode layers.

Any known adhesive may be used as the adhesive as long as it does not cause degradation of the performance of the actuator structure. In particular, an adhesive, for example, natural rubber, synthetic rubber, a mixture thereof, an acrylic polymer, or a block polymer, may be used as the adhesive.

In Japanese Patent Laid-Open No. 2007-028749, after an electrode layer is formed by plating on a surface of an electrolyte layer, electrodes are patterned to produce an actuator 5. For the actuator structure according to aspects of the embodiments, the patterning of the electrodes is not needed. The actuator structure according to aspects of the embodiments can be easily produced by simply stacking predetermined elastic electrode layers and electrode layers by pressure bonding. In this case, the electrolyte layers do not suffer damage or deterioration in a patterning step. The driving performance is advantageously improved also from the viewpoint of producing an element.

Japanese Patent Laid-Open No. 2009-55717 describes an actuator device in which electrolyte layers are arranged on both sides of a center electrode layer and outer electrode layers are arranged on outer sides of the electrolyte layers. The device includes a plurality of bending portions arranged successively. Adjacent bending portions bend in mutually opposite directions when a voltage is applied to the center electrode layer and the outer electrode layers.

However, the actuator device described in the patent document has a five-layer structure of electrode layer/electrolyte layer/electrode layer/electrolyte layer/electrode layer. Extra layer portions that do not contribute to bending act as a mechanical resistance; hence the actuator device is less likely to bend.

The actuator structure according to aspects of the embodiments includes regions where no electrolyte layer is present. So there is no such a mechanical resistance. In addition, the regions serve as spaces for bending; hence, the actuator structure bends easily.

Driving Principle of Actuator

While the driving principle of the actuator according to aspects of the embodiments is not clear, it is speculated that the application of a voltage between the pair of electrode layers causes the transfer of ions in the electrolyte layer. The driving principle of the actuator having, for example, the structure illustrated in FIG. 1A will be described below with reference to FIGS. 3A and 3B.

Figure 3A:
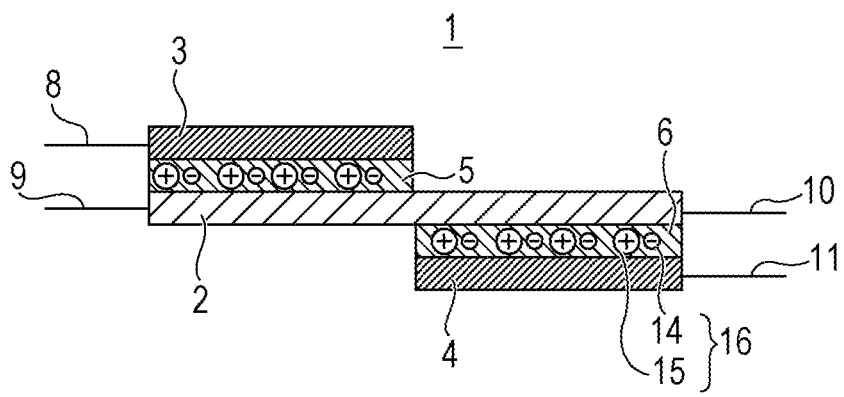
FIGS. 3A and 3B are schematic views of states of the actuator illustrated in FIG. 1A before and after its bending deformation.
Figure 3B:
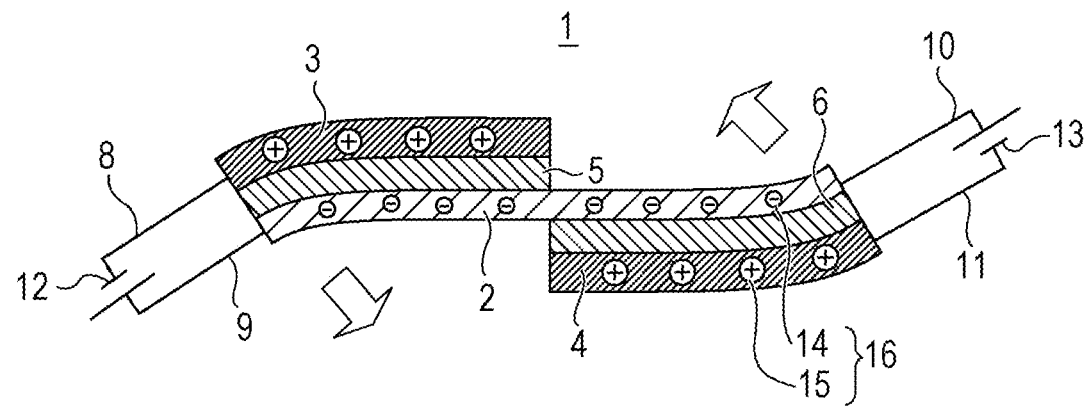
Figure 4A:
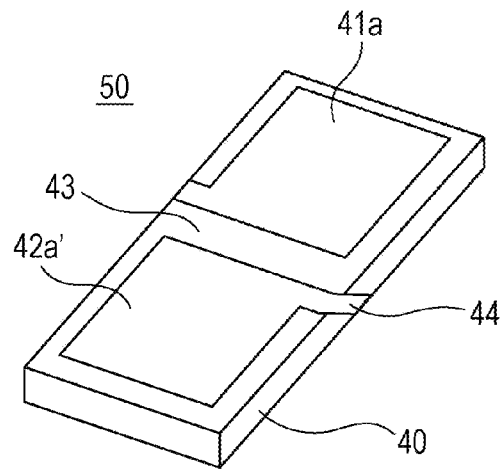
FIGS. 4A to 4D are schematic views of an actuator of the related art.
Figure 4B:
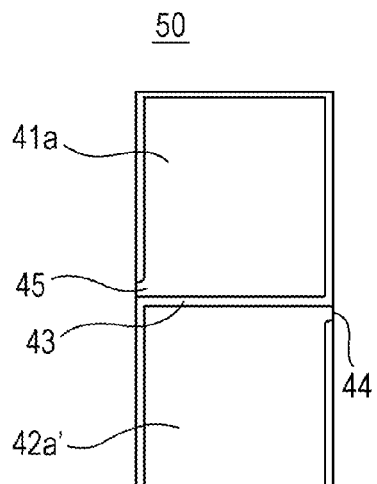
Figure 4C:
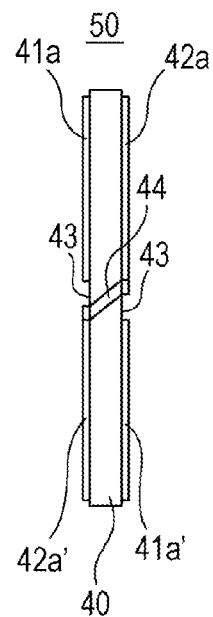
Figure 4D:
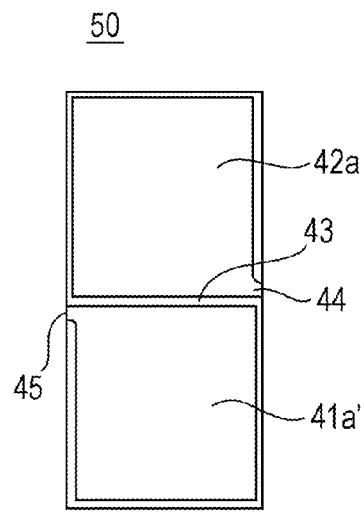

As illustrated in FIG. 3A, the first electrode layer 2, which is a common electrode, and the second electrode layer 3 are arranged on surfaces of the first electrolyte layer 5 so as to be insulated from each other. The first electrode layer 2 and the third electrode layer 4 are arranged on surfaces of the second electrolyte layer 6 so as to be insulated from each other. As illustrated in FIG. 3B, the application of a potential difference between the first electrode layer 2 and the second electrode layer 3 and between the first electrode layer 2 and the third electrode layer 4 allows cations 15 and anions 14 in an electrolyte 16 to be transferred toward the respective electrode layers. That is, the cations 15 are transferred and penetrated into the second electrode layer 3 and the third electrode layer 4, which serve as cathodes. The anions 14 are transferred and penetrated into the first electrode layer 2, which serves as an anode.

From the viewpoint of producing an actuator capable of operating in air, an ionic liquid with a negligible vapor pressure can be used as an electrolyte for use in the actuator according to an embodiment of the present invention. For the ionic liquid, the ionic radius of each of the cations 15 is larger than that of each of the anions 14. The second electrode layer 3 and the third electrode layer 4 are more expanded than the first electrode layer 2 because of the steric effects of ions in the electrode layers and so forth. That is, the cathodes are more expanded than the anode, so that the actuator bends in directions in which the cathodes extend.

As a result, the actuator in which adjacent bending portions bend in mutually opposite directions (directions indicated by block arrows in the figure) is provided. Usually, when the polarity of the potential is reversed, the layers undergo bending deformation in the opposite directions. Furthermore, the directions of displacement vary depending on the structures of the electrode layers and the electrolyte layers.

For the actuator having the structure, which is illustrated in FIG. 2A, including the plural first bending portions and the plural second bending portions, the first bending portions and the second bending portions being arranged alternately and successively in the longitudinal direction, the same phenomenon occurs. The amount of displacement is maximized at centers of bending portions, the centers being farthest from adjacent bending portions. The bending portions are displaced in directions indicated by the arrows in FIG. 2B when a voltage is applied.

A structure configured to apply a voltage to the electrode layers may be appropriately designed. As illustrated in FIGS. 3A and 3B, leads (8, 9, 10, and 11) connected to both ends of the actuator may be connected to power sources (12 and 13).

Alternatively, a structure may be used in which a member configured to hold both surfaces of the middle portion of the actuator 1 is arranged and includes a plurality of leads configured to apply a voltage to the electrode layers.

An applied voltage to an actuator according to aspects of the embodiments can be set to a value equal to or less than the withstand voltage of the electrolyte. For example, in the case where an ionic liquid is used as the electrolyte, the applied voltage can be set to 4 V or less.

Structure of Electrode Layer

With respect to the electrode layers according to aspects of the embodiments, at least the electrode layer (first electrode layer) common to adjacent bending portions may be an elastic electrode layer. A known electrode layer for use in actuators of the related art may be appropriately used as the elastic electrode layer. Examples of the electrode layer include an electrode layer made of at least a conductive material, such as carbon nanotubes (CNTs) serving as carbon fibers, and a polymer as described below; an electrode layer made of a CNT gel containing CNTs and an ionic liquid; and an electrode layer made of a conductive polymer. Furthermore, the electrode layer may be an electrode layer formed by pressing CNTs or may be composed of a metal. If the electrode layer is composed of a metal, a metal film, such as gold foil, or a metal mesh can be used because of satisfactory trackability to the bending of the actuator. These electrode layers may be used separately or in appropriate combination.

Any shape of each electrode layer may be used. An elongated shape can be used because a large amount of displacement is obtained at the time of the driving deformation of the actuator. Furthermore, the second and third electrode layers may not have the same size. Any size may be used in response to target properties of an actuator. Inner end portions of the second electrode layer and the third electrode layer may be aligned with each other. Alternatively, the second electrode layer and the third electrode layer may have an overlapping region. The presence of the overlapping region results in the reinforcement of the actuator. As with the case where the electrolyte layers have an overlapping region, it is possible to increase the stiffness of a region where inner end portions of driving sections, which bend in opposite directions, of the actuator.

So, even when an unanticipated load is applied in an unanticipated direction during the operation of the actuator, it is possible to prevent buckling or twisting of the actuator and to stably operate the actuator.

Here, the proportion of the overlapping region of the second and third electrode layers is defined as follows:

[Proportion of overlapping region of second and third electrode layers (%)]=[(area of overlapping region obtained by projecting second and third electrode layers onto plane of first electrode layer)/(area of first electrode layer)]×100    (expression A)

When the proportion is 100%, it is inevitably impossible to provide a plurality of bending portions. In this case, the size of the second and third electrode layers is equal to that of the first electrode layer.

In aspects of the present invention, it is essential that the surface A of the first electrode layer 2 has a region where the first electrolyte layer 5 is not arranged and that the surface B of the first electrode layer 2 has a region where the second electrolyte layer 6 is not arranged. That is, aspects of the present invention require a proportion of the overlapping region of less than 100%.

However, in the case where the proportion is 80% or more and less than 100%, the actuator can have excessively high stiffness, causing a reduction in the amount of displacement of the bending portions.

That is, the proportion of the overlapping region of the second and third electrode layers can be 80% or less.

To reinforce the stiffness of the region of the inner end portions of the driving sections of the actuator, the proportion of the overlapping region of the second and third electrode layers can be 0.1% or more. When the proportion of the overlapping region of the second and third electrode layers is less than 0.1%, a sufficient effect is not provided, in some cases.

Elastic Electrode Layer Composed of at Least Conductive Material and Polymer

One of carbon-based conductive materials or a mixture thereof may be contained as a conductive material for the electrode layers. Specific examples carbon-based conductive materials that may be used include graphite, carbon black, acetylene black, Ketjen black, carbon nanomaterials, such as carbon whiskers, and carbon nanoparticles, and carbon nanofibers, such as carbon nanotubes (CNTs). Alternatively, a conductive polymer, such as polypyrrole, as described below may be used.

Among these materials, carbon nanomaterials can be used from the viewpoint of achieving good conductivity and a high specific surface area. In particular, carbon nanotubes (CNTs) can be used.

Carbon nanofibers for use in an actuator according to aspects of the embodiments include carbon fibers, such as CNTs, graphite nanofibers, and carbon nanofibers. The term "CNTs" used here indicates cylindrical graphite sheets each having a cylindrical diameter of about 1 to about 10 nm. CNTs are broadly categorized into single-walled carbon nanotubes (SWCNTs) and multi-walled carbon nanotubes (MWCNTs), and various types are known. In an actuator according to this embodiment of the present invention, any type of CNT may be used.

The term "carbon nanofibers" used here indicates cylindrical graphite sheets each having a cylindrical diameter of 10 to 1000 nm. In particular, carbon-based fibers each having a thickness of 75 nm or more, having a hollow structure, and being often branched can be used as carbon nanofibers. Examples of commercially available carbon nanofibers include VGCF and VGNF manufactured by Showa Denko K.K.

The term "carbon nanoparticles" for use in an actuator according to aspects of the embodiments indicates nanoscale ($10^{-6}$ to $10^{-9}$ m) particles mainly composed of carbon, e.g., carbon nanohorns, amorphous carbon, and fullerenes, other than carbon nanotubes. The term "carbon nanohorns" indicates carbon nanoparticles each having a shape in which a graphite sheet is rounded into a conical shape and in which the tip is conically capped.

The term "graphene" for use in an actuator according to aspects of the embodiments indicates a graphite structure and the aggregate of carbon atoms in which six-membered carbon rings each having a planar structure are two-dimensionally arranged, graphene being formed of a single carbon layer.

In an actuator according to aspects of the embodiments, the amount of the conductive material added to each electrode layer can be set to 1% by mass or more with respect to the mass of the corresponding electrode layer. When the amount of the conductive material added is 1% by mass with respect to the mass of the corresponding electrode layer, each electrode layer can have an electrical conductivity sufficient to function as an electrode of the actuator. A conductive material content of less than 1% by mass can cause each electrode to have an insufficient electrical conductivity.

The foregoing polymer contained in the electrode layers is not particularly limited as long as it has flexibility sufficient to be deformed in response to the extending deformation of the actuator. The polymer can have a low degree of hydrolyzability and can have good stability in air.

Examples of the polymer that can be used to form the electrode layers include polyolefin polymers, such as polyethylene and polypropylene; polystyrenes; polyimides; polyarylenes (aromatic polymers), such as poly-p-phenylene oxide, poly(2,6-dimethylphenylene oxide), and poly-p-phenylene sulfide; compounds of polyolefin polymers, polystyrenes, polyimides, polyarylenes (aromatic polymers), and so forth substituted with functional groups, such as sulfonate groups (—SO$_3$H), carboxy groups (—COOH), phosphate groups, sulfonium groups, ammonium group, and pyridinium groups; fluorine-containing polymers, such as polytetrafluoroethylene and polyvinylidene fluoride; perfluorosulfonic acid polymers, perfluorocarboxylic acid polymers, and perfluorophosphoric acid polymers having skeletons of fluorine-containing polymers substituted with sulfonate groups, carboxyl groups, phosphate groups, sulfonium groups, ammonium groups, pyridinium groups, and so forth; polybutadiene-based compounds; urethane elastomers and urethane gels of polyurethane-based compounds; silicone-based compounds; polyvinyl chloride; polyethylene terephthalate; nylon; and polyarylate. These compounds may be used separately or in combination. These compounds may contain additional functional groups and may be copolymerized with other polymers.

In particular, a polyvinylidene fluoride-hexafluoropropylene copolymer (PVDF-HFP), polyvinylidene fluoride (PVDF), polymethyl methacrylate (PMMA), solid electrolyte membrane having high ionic conductivity, e.g., Nafion (manufactured by E.I. du Pont de Nemours and Company) and Flemion (manufactured by Asahi Glass Co., Ltd.), and so forth can be exemplified from the viewpoint of achieving good compatibility with the ionic liquid, etc. The polymer can have high compatibility with the electrolyte layers. Higher compatibility and bondability with the electrolyte layers make it possible to form stronger electrode layers. To the end, the polymer can have a polymer structure the same type, similar, or identical to that of a high molecular compound of each electrolyte layer. Alternatively, the polymer can have a functional group the same type, similar, or identical to that of a high molecular compound of each electrolyte layer.

As a conductive polymer used in the elastic electrode layers, the following conductive polymers may be used separately or in combination with the foregoing polymer materials and conductive materials. A material constituting the conductive polymer is not particularly limited. A material having excellent thin-film formability can be used. Examples of the conductive polymer that can be used include various known conductive polymers, such as polypyrroles, polythiophenes, polyanilines, and polyphenylenes.

In particular, a conductive polymer containing pyrrole and/or a pyrrole derivative in its molecular chain can be used because of easy production, good stability as a conductive polymer, and excellent elasticity. A conductive polymer film formed by electrolytic polymerization or a laminate of conductive polymer films formed by electrolytic polymerization can be used from the viewpoint of achieving good strength and physical properties of the film. Furthermore, the first electrode layer including a metal plate can be easily produced by electrolytic polymerization.

The thickness of each electrode layer is not particularly limited as long as the extending deformation of the actuator is not impaired. Each of the electrode layers preferably has a thickness of 1 µm to 5 mm, more preferably 5 µm to 2 mm, and still more preferably 10 µm to 500 µm. A thickness of each electrode layer of less than 1 µm results in electrode layers each having an electrical conductivity insufficient for the actuator. A thickness of each electrode layer exceeding 5 mm can result in electrode layers that are hard, fragile, and brittle because the electrode layers contain a conductive material. The anode electrode layer and the cathode electrode layers may not have the same thickness and may not be composed of the same materials. The thickness and material may be appropriately selected, depending on target properties of an actuator.

The electrode layers may contain an additional component other than the polymer and the conductive material as long as the additional component does not have an adverse effect on the function of the actuator. The polymer content can be in the range of 10% by mass to 60% by mass. A higher conductive material content with respect to the polymer content can result in a higher conductivity. A polymer content of less than 5% by mass can result in electrode layers which have poor self-supporting properties and which are mechanically fragile. At a polymer content exceeding 80% by mass, the conductive material content is relatively reduced. Hence, it can be difficult to practically use the actuator in view of the response speed and the generative force of the actuator.

Electrolyte Layer

The electrolyte layers according to aspects of the embodiments are composed of a flexible material containing an electrolyte, e.g., a polymer containing an electrolyte. Examples of the electrolyte layers include layers made of solid electrolyte membranes mainly composed of fluorine-containing polymers, such as Nafion (registered trademark, manufactured by E.I. du Pont de Nemours and Company) and Flemion (registered trademark, manufactured by Asahi Glass Co., Ltd.); and layers made of quasi-solid electrolytes and gel electrolytes containing electrolytic substances and electrolytic solutions.

Any shape of each electrolyte layer may be used. An elongated shape can be used because a large amount of displacement is obtained at the time of the driving deformation of the actuator.

The electrolyte layers in contact with the second and third electrode layers may not have the same size. Any size may be used in response to target properties of an actuator as long as electrical insulation is maintained. In the case where the electrolyte layers of adjacent bending portions have the overlapping region with the first electrode layer provided therebetween as illustrated in FIG. 1C, the arrangement of the electrolyte layers makes it possible to improve the operation durability of the actuator.

Here, the proportion of the overlapping region of the first and second electrolyte layers is defined as follows:

[Proportion of overlapping region of first and second electrolyte layers (%)]=[(area of overlapping region obtained by projecting each electrolyte layer onto plane of first electrode layer)/(area of first electrode layer)]×100      (expression B)

The proportion of the overlapping region may be appropriately adjusted in the range of 0% to 100%, depending on target service properties of the actuator, as long as the driving performance of the actuator is not reduced.

When the proportion of the overlapping region of the electrolyte layers (expression B) is 80% or more, the actuator can have excessively high stiffness, causing a reduction in the amount of displacement of the bending portions. When the proportion of the overlapping region of the electrolyte layers is less than 0.1%, the stiffness of the region of the inner end portions of the driving sections of the actuator is not sufficiently increased, in some cases.

Examples of the polymer include fluorine-containing polymers, such as tetrafluoroethylene, polyvinylidene fluoride; polyolefin polymers, such as polyethylene and polypropylene; polybutadiene-based compounds; polyurethane-based compounds; silicone-based compounds; thermoplastic polystyrene; polyvinyl chloride; and polyethylene terephthalate. These compounds may be used separately or in combination. These compounds may contain additional functional groups and may be copolymerized with other polymers.

The incorporation of an electrolyte into the polymer makes it possible to produce an actuator in which ions are transferred by the application of a voltage.

Examples of the electrolyte that can be used include lithium fluoride, lithium bromide, sodium bromide, magnesium chloride, copper sulfate, sodium acetate, sodium oleate, and sodium acetate.

The electrolyte may be an ionic liquid. In this case, a polyvinylidene fluoride-hexafluoropropylene copolymer (PVDF-HFP), polyvinylidene fluoride (PVDF), perfluorosulfonic acid (Nafion), 2-hydroxyethyl methacrylate (HEMA), polymethyl methacrylate (PMMA), polyethylene oxide (PEO), and polyacrylonitrile (PAN) can be used as the polymer.

The ionic liquid for use in an actuator according to aspects of the embodiments is also referred to as an ordinary temperature molten salt or a fused salt. The ionic liquid is a salt which is present in a molten state in a wide temperature range including ordinary temperature (room temperature). For example, the salt is present in a molten state at 0° C., preferably −20° C., and more preferably −40° C. The ionic liquid can have high ion conductivity.

In an actuator according to aspects of the embodiments, various known ionic liquids may be used. An example of the ionic liquid that can be used is, but not limited to, an ionic liquid that is stably present in a liquid state at ordinary temperature (room temperature) or a temperature near ordinary temperature. Examples of the ionic liquid that can be used for an actuator according to aspects of the embodiments include imidazolium salts, pyridinium salts, ammonium salts, and phosphonium salts. These ionic liquids may be used in combination of two or more thereof.

More specifically, compounds composed of cations (e.g., an imidazolium ion) represented by formulae (1) to (4) and anions can be exemplified as the ionic liquids.

[Chem. 1]

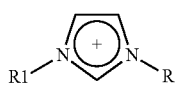
(1)

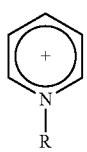
(2)

$[NR_xH_{4-x}]^+$ (3)

$[PR_xH_{4-x}]^+$ (4)

In each of formulae (1) to (4), R represents an alkyl group having 1 to 12 carbon atoms or an alkyl group having an ether bond and a total number of carbon atoms and oxygen atoms of 3 to 12. In formula (1), R1 represents an alkyl group having 1 to 4 carbon atoms. In formula (1), R and R1 may be different. In each of formulae (3) and (4), x represents an integer of 1 to 4.

Examples of the anion include a tetrafluoroboric acid anion, a hexafluorophosphoric acid anion, a bis(trifluoromethanesulfonyl)imidic acid anion, a perchloric acid anion, a tris(trifluoromethanesulfonyl)carbon acid anion, a trifluoromethanesulfonic acid anion, a dicyanamide anion, a trifluoroacetic acid anion, an organic carboxylic acid anion, and a halogen ion. At least one selected from these anions can be used.

Each of the electrolyte layers preferably has a thickness of 10 μm to 500 μm and more preferably 10 μm to 400 μm. A thickness exceeding 500 μm can result in an increase in elastic modulus, thereby suppressing the deforming motion of the actuator. At a thickness of less than 10 μm, the amount of an ionic substance is small. So, the amount of ions fed into the electrode layers can be reduced, thereby leading to insufficient bending motions.

Reinforcing Component

Examples of the reinforcing component that can be appropriately used include polymer films, polymer fibers, nonwoven fabrics made of polymer fibers, thin metallic wire (including metal whiskers and so forth), metal bars, and metal plates, such as plate springs.

In the case of the reinforcing component composed of a polymer film, the reinforcing component can be subjected to stretch orientation treatment from the viewpoint of improving the stiffness. Polymer fibers produced by an electrospinning method (described in detail in, for example, "Electrospinning Saizensen" (Leading Edge of Electrospinning), published by Sen'i shay, in which stretching is performed in the course of the production of fibers, can be used.

In the case of the reinforcing component made of a metal, a metal that is not corroded by electrolyte ions can be used from the viewpoint of achieving good operation durability. Examples of the metal that can be appropriately used include gold, platinum, corrosion-resistant stainless steel, and known surface-treated metal materials including anticorrosion coating layers.

The reinforcing component made of a metal can be in the form of a film or mesh in view of trackability to the bending of the actuator.

In the case where the metal plate is a plate spring, it is necessary to prevent the corrosion of the plate spring. The plate spring is very susceptible to a corrosive atmosphere. Corrosion is likely to cause a reduction in spring performance. To suppress the reduction in spring performance, a material having high corrosion resistance in a corrosive environment, for example, a stainless steel material or Inconel (registered trademark), can be used. The number, shape, and size of the reinforcing components are not particularly limited. A plurality of reinforcing components having different properties may be used in combination.

The thickness of the reinforcing component is not particularly limited as long as the bending deformation of the actuator is not impaired. The thickness of the reinforcing component can be in the range of 1/100 to 1/2 of the total thickness of the electrode layer including the reinforcing component. When the thickness of the reinforcing component exceeds 1/2 of the total thickness of the electrode layer, the electrode layer as a whole tends to become hard, brittle, and fragile. When the thickness of the reinforcing component is less than 1/100 of the total thickness of the electrode layer, the effect of increasing the strength of the electrode layer as a whole is small, thereby failing to improve the operation durability of the actuator as a whole, in some cases.

Production of Actuator

A method for producing an actuator according to aspects of the embodiments will be described in detail below.

(1) Production of Elastic Electrode Layer

A method for producing an electrode layer according to this embodiment is not particularly limited. For example, the electrode layer may be produced as described below.

A specific example of a method for producing an elastic electrode layer composed of CNTs and a polymer will be described below.

First, SWCNTs (50 mg, average diameter: about 1 nm, average length: about 1 μm, trade name: HiPco, manufactured by Unidym Inc.) serving as a conductive material, 1-butyl-3-methylimidazolium tetrafluoroborate (BMIBF4, ionic liquid, 80 mg), dimethylformamide (1 mL, hereinafter referred to as "DMF") are mixed. The mixture is subjected to ball milling for 30 minutes. A polyvinylidene fluoride-hexafluoropropylene copolymer (PVDF-HFP, 80 mg) dissolved in DMF (2 mL) is added to the mixture. The resulting mixture is subjected to ball milling for another 30 minutes to form a black paste in which CNTs are dispersed. The black paste is cast on a fluorocarbon resin mold and dried to form a sheet. The sheet is cut into pieces having predetermined dimensions (for example, 1 mm wide by 50 mm long, and 1 mm wide by 25 mm long), thereby producing elastic electrode layers. The resulting layers have an electrical conductivity of about 13 S/cm.

(2) Production of Electrolyte Layer

Any method for producing an electrolyte layer according to this embodiment may be employed as long as the foregoing electrolyte layer is produced. For example, the electrolyte layer can be produced as described below. A specific example of a method for producing an electrolyte layer composed of an ionic liquid and a polymer will be described below.

PVDF-HFP (100 mg) is mixed with a tetrahydrofuran (THF)/acetonitrile (5/1) mixed solvent, and BMIBF4 (100 mg) at 80° C. The resulting mixture is cast and dried to form a sheet. The sheet is cut into pieces having predetermined dimensions (for example, 1 mm wide by 25 mm long), thereby producing electrolyte layers.

(3) Production of First Electrode Layer

Any method for producing the first electrode layer may be employed. A method for producing the first electrode layer including a metal plate serving as a reinforcing component will be specifically described below.

Similarly to item (1), a black paste in which CNTs are dispersed is prepared. Half the amount of the black paste is cast on a fluorocarbon resin mold and dried briefly to form a film. A metal plate, composed of stainless steel (SUS304), having predetermined dimensions (for example, 1 mm wide by 50 mm long) is stacked on the resulting film. Then the remaining black paste is cast and dried to form a laminate. The laminate is cut into a piece having predetermined dimensions, thereby producing an electrode layer including the metal plate.

(4) Production of Actuator

With respect to a method for producing an actuator according to this embodiment, a method can be employed in which the electrode layers and the electrolyte layers produced as described above are stacked so as to form a predetermined structure and the resulting stack is subjected to hot pressing (heat press bonding).

The term "hot pressing" used here includes a method in which the stack is pressed under heat; and a method in which the stack is heated with the stack pressed.

The temperature, pressing pressure, and time in the hot pressing are not particularly limited as long as the temperature is less than the decomposition temperature of the foregoing polymer. These conditions may be appropriately determined in response to a polymer used, a polymer compound contained in the actuator, and the type of ion transferred. For example, the temperature in the hot pressing can be in the range of 30° C. to 150° C. The pressing pressure is preferably in the range of 1 kg/cm$^2$ to 100 kg/cm$^2$ and more preferably 10 kg/cm$^2$ to 50 kg/cm$^2$.

Water, an ion-conducting material, the ionic liquid, or a mixture thereof may be incorporated into a laminated structure formed by hot pressing or the like after the production of the laminated structure. In this case, the structure may be immersed in its solution for impregnation. The concentration of the solution and the time for impregnation are not particularly limited, and a known method of the related art may be employed.

The shape of an actuator according to an embodiment of the present invention is not limited to those described above. An element of any shape can be easily produced.

Specific Structure of First Embodiment

A specific example of an actuator according to this embodiment will be described below in more detail.

FIG. 1A is a perspective view of an actuator according to this embodiment.

The actuator according to this embodiment includes the first electrode layer 2 formed of a plate-shape member having the surface A and the surface B that is opposite the surface A. The first electrode layer 2 serves as an electrode layer common to adjacent bending portions and has an elongated shape and elasticity. The first electrolyte layer 5 is arranged so as to be in contact with a portion of the surface A of the first electrode layer 2. The second electrolyte layer 6 is arranged so as to be in contact with a portion of the surface B of the first electrode layer 2. Each of the second electrode layer 3 and the third electrode layer 4 is arranged so as to be in contact with a corresponding one of the first electrolyte layer 5 and second electrolyte layer 6 and so as to be located on a side of the corresponding electrolyte layer opposite the side adjacent to the first electrode layer 2. The second electrode layer 3 and third electrode layer 4 function as counter electrodes.

Here, the first electrolyte layer 5 and the second electrode layer 3 have the same size. The second electrolyte layer 6 and the third electrode layer 4 have the same size. Furthermore, the width (size in the lateral direction) of the first and second electrolyte layers 5 and 6 and the second and third electrode layers 3 and 4 is equal to the width of the first electrode layer 2. The length (size in the longitudinal direction) of the first and second electrolyte layers 5 and 6 and the second and third electrode layers 3 and 4 is half the length of the first electrode layer 2.

That is, the surface A of the first electrode layer 2 has a region where the first electrolyte layer 5 is not arranged. The surface B of the first electrode layer 2 has a region where the second electrolyte layer 6 is not arranged.

In other words, the surfaces A and B of the first electrode layer 2 have the regions where the second and third electrode layers 3 and 4 are not arranged. Thereby, two adjacent bending portions that bend in mutually opposite directions by the application of a voltage are provided.

The second electrode layer 3 and the first electrolyte layer 5 are arranged so as to be aligned with an end portion of the first electrode layer 2 in the longitudinal direction. Similarly, the third electrode layer 4 and the second electrolyte layer 6 are arranged so as to be aligned with the other end portion of the first electrode layer 2 in the longitudinal direction.

That is, the second electrode layer 3 opposite a portion of the surface A of the first electrode layer 2 and the third electrode layer 4 opposite a portion of the surface B of the first electrode layer 2 are arranged with the electrolyte layers and the first electrode layer 2 provided therebetween in such a manner that the inner end portion of the second electrode layer 3 is aligned with the inner end portion of the third electrode layer 4.

All electrode layers are composed of the CNTs and the polymer. The electrolyte layers are composed of the ionic liquid and the polymer. These electrode layers and the electrolyte layers are press-bonded by the hot pressing, thereby providing the actuator 1.

The application of a driving voltage of 4 to 5 V between the first and second electrode layers 2 and 3 and between the first and third electrode layers 2 and 4 of the actuator 1 having this structure causes adjacent bending portions of the actuator 1 to bend in mutually opposite directions. The first electrode layer 2 is defined as a first electrode. The second electrode layer 3 and the third electrode layer 4 are defined as second electrodes (serving as counter electrodes to the first electrode layer 2) having the same polarity. The first and second electrolyte layers 5 and 6 are interposed between the first electrode and the second electrodes. A voltage is applied between the first electrode layer 2 and the second electrode layer 3 and between the first electrode layer 2 and the third electrode layer 4.

A structure configured to apply a voltage may be a structure in which the leads are connected to the electrodes and the driving power sources as illustrated in FIG. 3B.

The second electrode layer 3 and the third electrode layer 4 are connected so as to have the same potential. When a driving voltage of 4 to 5 V from the driving power sources is applied between the first electrode layer 2 and the second electrode layer 3 and between the first electrode layer 2 and the third electrode layer 4 of the actuator 1, the first and second bending portions that are adjacent to each other bend in mutually opposite directions in the same amount of displacement.

The second electrode layer 3 opposite a portion of the surface A of the first electrode layer 2 and the third electrode layer 4 opposite a portion of the surface B of the first electrode layer 2 are arranged with the electrolyte layers and the first electrode layer 2 provided therebetween in such a manner that the inner end portion of the second electrode layer 3 is aligned with the inner end portion of the third electrode layer 4.

The first electrode layer 2 is arranged as an electrode common to two bending portions and as an axis of the actuator, thereby resulting in high operation durability. In addition, the inner end portions of the outer electrode layers are aligned with the inner end portions of the electrolyte layers. Thus, bending motions of the bending portions are not precluded.

Even if the actuator according to this embodiment is repeatedly driven with loads applied in directions opposite to bending directions, it is possible to drive the actuator without a reduction in driving performance. Thus, the actuator has excellent reliability for practical use.

Second Embodiment

As a modification of the first embodiment, an actuator in which two or more bending portions that are adjacent to each other are juxtaposed will be described below with reference to FIGS. 2A and 2B. The actuator according to this embodiment includes a plurality of first bending portions and a plurality of second bending portions. The first bending portions and the second bending portions are arranged alternately and successively in the longitudinal direction (the longitudinal direction of the first electrode layer). That is, the actuator has a structure in which a plurality of the actuator illustrated in FIG. 1A are juxtaposed. Similarly to the first embodiment, a plurality of the electrode layers and a plurality of the electrolyte layers are stacked on the surface A and the surface B of the first electrode layer in a staggered manner. Then the resulting structure is subjected to heat press bonding, thereby simply providing the actuator.

Electrical connections to the second electrode layers and the third electrode layers can be appropriately set, depending on a structure used. Leads may be connected to the second electrode layers from the upper side of the actuator. Leads may be connected to the third electrode layers from the lower side of the actuator. Alternatively, leads may be connected to the second and third electrode layers from the side (in the lateral direction) of the actuator.

In this embodiment, it is possible to generate a greater force than that in the first embodiment. The resulting actuator has high operation durability and excellent reliability for practical use.

FIGS. 2A and 2B illustrate the actuator 1 having a structure in which a plurality of the second electrode layers 3 and a plurality of the third electrode layers 4 are arranged on the first electrode layer 2 with the electrolyte layers 5 and 6 provided therebetween. The actuator according to this embodiment includes three actuators illustrated in FIG. 1A are juxtaposed on the basis of the first electrode layer. This structure easily provides the actuator having a generative force several times that of the actuator illustrated in FIG. 1A.

Third Embodiment

This embodiment is a modification of the actuator 1 according to the first embodiment. An actuator includes a first electrode layer common to first and second bending portions adjacent to each other; and a metal plate serving as a reinforcing component in the common first electrode layer.

FIG. 1B is a perspective view of an actuator according to a third embodiment of the present invention. In FIG. 1B, the actuator 1 according to the third embodiment may be produced as in the first embodiment, except that the first electrode layer includes a metal plate 7.

Here, as the first electrode layer including the metal plate, the foregoing electrode layer formed of CNTs, a polymer, and a metal plate composed of stainless steel (SUS304) is used. In FIG. 1B, the metal plate 7 composed of stainless steel (SUS304) is arranged between first electrode sublayers 2a and 2b.

The second electrode layer (common electrode layer) of the actuator 1 includes the metal plate 7 and thus has higher operation durability. Even if the actuator according to this embodiment is repeatedly driven with loads applied in directions opposite to bending directions while horizontal oscillation is applied, it is possible to drive the actuator without a reduction in driving performance. Thus, the actuator has excellent reliability for practical use.

Fourth Embodiment

This embodiment is a modification of the actuator 1 according to the first embodiment. The actuator 1 includes electrolyte layers of first and second bending portions adjacent to each other, the electrolyte layers having an overlapping region with a first electrode layer provided therebetween.

FIG. 1C is a perspective view of an actuator according to this embodiment. The actuator 1 illustrated in FIG. 1C may be produced as in the first embodiment, except that the length of each of the first and second electrolyte layers 5 and 6 in the longitudinal direction is 1.2 times that of a corresponding one of the electrolyte layers used in the first embodiment. In this case, the proportion of the overlapping region is 20%.

The actuator 1 includes the overlapping region of the electrolyte layers between two bending portions and thus has higher operation durability than that in the first embodiment. Even if the actuator is repeatedly driven with loads applied in directions opposite to bending directions while horizontal oscillation is applied, it is possible to drive the actuator without a reduction in driving performance. Thus, the actuator has excellent reliability for practical use.

Fifth Embodiment

FIG. 5 is a schematic view of an actuator structure in which a plurality of the actuator according to the second embodiment are stacked. The plural actuators illustrated in FIG. 2A are stacked in such a manner that bending portions face each other. That is, the actuators are arranged in such a manner that bending portions of adjacent actuators are in contact with each other and bend in mutually opposite directions. Similarly to the second embodiment, the application of a voltage to the electrodes allows the bending portions to bend, thereby causing displacement in the laminated directions (in the directions indicated by arrows in FIG. 5) and generating a force. In an upper actuator and a lower actuator that are adjacent to each other in the figure, only bottom portions of the bending portions of the upper actuator and only top portions of the bending portions of the lower actuator are bonded using an adhesive 500 with copper wire 600 provided therebetween, the bending portions bending in mutually opposite directions. The use of the actuator structure results in a device that exhibits a large amount of displacement and a large generative force in a predetermined direction.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-176366 filed Aug. 5, 2010, which is hereby incorporated by reference herein in its entirety.

What is claimed is:

1. An actuator comprising:
    a first bending portion comprising
        a first electrode layer,
        a first electrolyte layer on a first surface of the first electrode layer, and
        a second electrode layer in contact with the first electrolyte layer; and
    a second bending portion comprising
        the first electrode layer,
        a second electrolyte layer on a second surface of the first electrode layer, the second surface facing the first surface, and
        a third electrode layer in contact with the second electrolyte layer,
    wherein the first surface of the first electrode layer includes a region where the first electrolyte layer is not arranged,
    the second surface of the first electrode layer includes a region where the second electrolyte layer is not arranged,
    the first bending portion is adjacent to the second bending portion, and
    the bending direction of the first bending portion is opposite to the bending direction of the second bending portion.

2. The actuator according to claim 1, wherein the application of a voltage between the first electrode layer and the second electrode layer causes the first bending portion to bend, and the application of a voltage between the first electrode layer and the third electrode layer causes the second bending portion to bend.

3. The actuator according to claim 1, wherein the first electrode layer is formed of a plate-shape member.

4. The actuator according to claim 1, wherein the actuator includes a plurality of the first bending portions and a plurality of the second bending portions, and the first bending portions and the second bending portions are arranged alternately and successively in the longitudinal direction.

5. The actuator according to claim 1, wherein the first electrode layer includes a reinforcing component.

6. The actuator according to claim 1, wherein the electrolyte layers of the bending portions adjacent to each other include an overlapping region with the first electrode layer provided therebetween.

7. An actuator structure comprising:
    a plurality of the actuators, each of the actuators comprising:
        a first bending portion comprising
            a first electrode layer,
            a first electrolyte layer on a first surface of the first electrode layer, and
            a second electrode layer in contact with the first electrolyte layer; and
        a second bending portion comprising
            the first electrode layer,
            a second electrolyte layer on a second surface of the first electrode layer, the second surface facing the first surface, and
            a third electrode layer in contact with the second electrolyte layer,
        wherein the first surface of the first electrode layer includes a region where the first electrolyte layer is not arranged,
        the second surface of the first electrode layer includes a region where the second electrolyte layer is not arranged,
        the first bending portion is adjacent to the second bending portion, and
        the bending direction of the first bending portion is opposite to the bending direction of the second bending portion, and
    wherein the actuator includes a plurality of the first bending portions and a plurality of the second bending portions, and the first bending portions and the second bending portions are arranged alternately and successively in the longitudinal direction;
    wherein the actuators are stacked, and
    bending portions of adjacent actuators are arranged so as to be in contact with each other and bend in mutually opposite directions, whereby the actuator structure is displaced in laminated directions.

* * * * *